United States Patent
Zhang

(10) Patent No.: US 10,957,276 B2
(45) Date of Patent: Mar. 23, 2021

(54) POWER-OFF DISCHARGE CIRCUIT AND OPERATION METHOD OF DISPLAY PANEL, AND DISPLAY SUBSTRATE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventor: Yuanping Zhang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 27 days.

(21) Appl. No.: 16/453,030

(22) Filed: Jun. 26, 2019

(65) Prior Publication Data
US 2020/0035189 A1    Jan. 30, 2020

(30) Foreign Application Priority Data
Jul. 26, 2018   (CN) .......................... 201810835571.5

(51) Int. Cl.
*G09G 3/36*       (2006.01)
*H03K 17/687*     (2006.01)

(52) U.S. Cl.
CPC ....... *G09G 3/3696* (2013.01); *H03K 17/6871* (2013.01); *G09G 2330/027* (2013.01)

(58) Field of Classification Search
CPC ........... G09G 3/3696; G09G 2330/027; G09G 3/3677; G09G 2330/021;
(Continued)

(56) References Cited

U.S. PATENT DOCUMENTS

2003/0034965 A1\* 2/2003 Kim ..................... G09G 3/3696
                                                      345/211
2003/0218593 A1\* 11/2003 Inoue ................... G09G 3/3655
                                                       345/92

(Continued)

FOREIGN PATENT DOCUMENTS

CN    101174072 A      5/2008
CN    106356033 A  \*  1/2017
(Continued)

OTHER PUBLICATIONS

First Office Action dated May 8, 2020 corresponding to Chinese application No. 201810835571.5.

*Primary Examiner* — Michael J Jansen, II
*Assistant Examiner* — Ivelisse Martinez Quiles
(74) *Attorney, Agent, or Firm* — Nath, Goldberg & Meyer; Joshua B. Goldberg

(57) ABSTRACT

A power-off discharge circuit and an operation method of a display panel, and a display substrate are provided. The power-off discharge circuit includes a switching circuit and a power storage circuit. The switching circuit is coupled to the first transmission line and the second transmission line and configured to control a connection between the first transmission line and the second transmission line in response to a first control signal, and to control a connection between the second output terminal of the power management circuit and the second input terminal of the gate driving circuit in response to a second control signal. The power storage circuit is coupled to the first transmission line and configured to perform, in response to a power control signal, one of storing power transmitted from the first transmission line and supplying stored power to the first transmission line.

16 Claims, 3 Drawing Sheets

(58) Field of Classification Search
CPC ... G09G 2320/0257; G09G 3/36–3696; G09G 2330/02; G09G 2320/046; H03K 17/6871
See application file for complete search history.

(56) References Cited

U.S. PATENT DOCUMENTS

| | | | |
|---|---|---|---|
| 2007/0176866 A1 | 8/2007 | Hung et al. | |
| 2008/0165109 A1 | 7/2008 | Joo et al. | |
| 2009/0278590 A1* | 11/2009 | Chang | G09G 3/3696 327/434 |
| 2011/0075063 A1* | 3/2011 | Tajiri | G09G 3/3258 349/42 |
| 2019/0304391 A1* | 10/2019 | Zou | G09G 3/3648 |

FOREIGN PATENT DOCUMENTS

| | | |
|---|---|---|
| CN | 106356033 A | 1/2017 |
| JP | 200255323 A | 2/2002 |
| TW | 201312533 A1 | 3/2013 |

\* cited by examiner

POWER-OFF DISCHARGE CIRCUIT AND OPERATION METHOD OF DISPLAY PANEL, AND DISPLAY SUBSTRATE

CROSS-REFERENCE TO RELATED APPLICATIONS

The present disclosure claims the priority of the Chinese Patent Application No. 201810835571.5, filed on Jul. 26, 2018, the contents of which are incorporated herein by reference in their entirety.

TECHNICAL FIELD

The disclosure relates to the field of display technology, in particular, to a power-off discharge circuit for a display panel, a method for operating a display panel, and a display substrate.

BACKGROUND

A display panel generally includes a power management integrated circuit, a gate driving circuit, and a source driving circuit. The power management integrated circuit may supply power to the gate driving circuit and the source driving circuit. In general, the power management integrated circuit and the source driving circuit may be disposed on an array substrate in a form of chip. The gate driving circuit may be disposed on the array substrate in a form of chip, or in a form of Gate Driver on Array (GOA).

SUMMARY

According to an aspect of the present disclosure, a power-off discharge circuit for a display panel is provided, and the display panel includes a power management circuit and a gate driving circuit. A first output terminal of the power management circuit is coupled to a first input terminal of the gate driving circuit via a first transmission line, and a second output terminal of the power management circuit is coupled to a second input terminal of the gate driving circuit via a second transmission line. The power-off discharge circuit includes: a switching circuit, coupled to the first transmission line and the second transmission line and configured to control a connection between the first transmission line and the second transmission line in response to a first control signal, and to control a connection between the second output terminal of the power management circuit and the second input terminal of the gate driving circuit in response to a second control signal; and a power storage circuit, coupled to the first transmission line and configured to perform, in response to a power control signal, one of storing power transmitted from the first transmission line and supplying stored power to the first transmission line.

In an embodiment, the power-off discharge circuit further includes a first discharge circuit. The first discharge circuit is coupled to data lines of the display panel and configured to control a connection between the data lines and the ground in response to a third control signal.

In an embodiment, the power-off discharge circuit further includes a one-way conduction circuit. The one-way conduction circuit is coupled between the switching circuit and the second input terminal of the gate driving circuit. The one-way conduction circuit is configured to only allow a current to flow from the switching circuit to the second input terminal of the gate driving circuit.

In an embodiment, the power-off discharge circuit further includes a second discharge circuit. The second discharge circuit is coupled to the second output terminal of the power management circuit and the power storage circuit and configured to control a connection between the second output terminal of the power management circuit and the ground in response to a fourth control signal from the power storage circuit.

In an embodiment, the power storage circuit includes a first transistor, a second transistor, a first resistor, a second resistor, and a storage capacitor. A control electrode of the first transistor is coupled to a second terminal of the first resistor and a first terminal of the second resistor respectively, a first electrode of the first transistor is coupled to a first terminal of the storage capacitor, and a second electrode of the first transistor is coupled to a first terminal of the first resistor and the first transmission line respectively. A control electrode of the second transistor is coupled to a power control terminal of the power management circuit, a first electrode of the second transistor is coupled to the second output terminal of the power management circuit, and a second electrode of the second transistor is coupled to a second terminal of the second resistor. A second terminal of the storage capacitor is grounded.

In an embodiment, the switching circuit includes a fourth transistor and a fifth transistor. A control electrode of the fourth transistor is coupled to a first control signal line for supplying the first control signal, a first electrode of the fourth transistor is coupled to the first transmission line, and a second electrode of the fourth transistor is coupled to the second transmission line. A control electrode of the fifth transistor is coupled to a second control signal line for supplying the second control signal, a first electrode of the fifth transistor is coupled to the second output terminal of the power management circuit, and a second electrode of the fifth transistor is coupled to the second input terminal of the gate driving circuit.

In an embodiment, the first discharge circuit includes a plurality of sixth transistors in one-to-one correspondence with the data lines. Control electrodes of the plurality of sixth transistors are respectively coupled to a discharge control terminal for supplying the third control signal, first electrodes of the plurality of sixth transistors are respectively coupled to corresponding data lines, and second electrodes of the plurality of sixth transistors are grounded.

In an embodiment, the second discharge circuit includes a third transistor. A control electrode of the third transistor is coupled to the second terminal of the second resistor, a first electrode of the third transistor is grounded, and a second electrode of the third transistor is coupled to the second output terminal of the power management circuit.

In an embodiment, the one-way conduction circuit includes a diode. An anode of the diode is coupled to the second electrode of the fifth transistor, and a cathode of the diode is coupled to the second input terminal of the gate driving circuit.

In an embodiment, the first transistor has a first conductive type; and each of the second transistor, the third transistor, the fourth transistor, the fifth transistor, and the sixth transistor has a second conductive type different from the first conductive type.

According to an aspect of the present disclosure, a display substrate including the power-off discharge circuit describe above is provided.

According to an aspect of the present disclosure, a method for operating a display panel is provided, and the display panel includes a power management circuit and a gate driving circuit. A first output terminal of the power management circuit is coupled to a first input terminal of the gate driving circuit via a first transmission line, and a second output terminal of the power management circuit is coupled to a second input terminal of the gate driving circuit via a second transmission line. The method includes: during a power-off stage of the display panel, coupling, by a switching circuit, the first transmission line to the second transmission line, and disconnecting the second transmission line from the power management circuit; and supplying, by a power storage circuit, power stored in the power storage circuit to the first transmission line, such that the gate driving circuit outputs an active level.

In an embodiment, the method further includes: during a display stage of the display panel, coupling, by the switching circuit, the first output terminal of the power management circuit to the first input terminal of the gate driving circuit via the first transmission line, and coupling, by the switching circuit, the second output terminal of the power management circuit to the second input terminal of the gate driving circuit via the second transmission line.

In an embodiment, the method further includes: storing, by the power storage circuit, a part of power output from the power management circuit, during a display stage of the display panel.

In an embodiment, the method further includes: coupling, by a first discharge circuit, data lines of the display panel to the ground so as to discharge pixel electrodes in the display panel during the power-off stage of the display panel.

In an embodiment, the method further includes: disconnecting, by the first discharge circuit, the data lines from the ground, during a display stage of the display panel.

In an embodiment, the method further includes: only allowing, by a one-way conduction circuit, a current to flow from the switching circuit to the second input terminal of the gate driving circuit.

In an embodiment, the method further includes: coupling, by a second discharge circuit, the second output terminal of the power management circuit to the ground so as to discharge the power management circuit during the power-off stage of the display panel.

DETAILED DESCRIPTION

In order to avoid an afterimage after a liquid crystal display (LCD) is powered off, it is required to discharge pixel electrodes in a display panel during the power-off stage. That is, during the power-off stage, a gate driving circuit outputs an active level to gate lines simultaneously, so as to control the display transistors in the display panel to be turned on so that each of the pixel electrodes is coupled to a corresponding data line; and further, the data lines are coupled to the ground via a discharge circuit, such that each of the pixel electrodes is discharged through the corresponding data line.

During a process in which the gate driving circuit outputs an active level to the gate lines, a power management integrated circuit is required to constantly supply a high-level voltage to two input terminals of the gate driving circuit. However in practical applications, since a power control signal provided to a power control terminal of the power management integrated circuit has a fast switching speed (i.e., a fast drop speed of voltage) during the power-off stage, the power management integrated circuit supplies the high-level voltage for a very short time during the power-off stage and the gate driving circuit outputs the active level for a very short time, such that the display transistors can be on only for a short time, thereby resulting in insufficient discharging of the pixel electrodes and the afterimage of the displayer.

In order to enable those skilled in the art to better understand the technical solutions of the present disclosure, the present disclosure will be further described in detail below in conjunction with the drawings.

According to an embodiment of the present disclosure, a display panel includes a display substrate which is an array substrate. A plurality of gate lines and a plurality of data lines that intersect with each other to define a plurality of pixel circuits are disposed on the array substrate, and a display transistor and a pixel electrode are provided in each of the pixel circuits. A control electrode of the display transistor is coupled to a corresponding gate line, a first electrode of the display transistor is coupled to a corresponding data line, and a second electrode of the display transistor is coupled to a corresponding pixel electrode.

In the following description, an exemplary description is given by taking a case where the display transistor is an N-type transistor. In this case, an active level output by the gate driving circuit for driving the display transistors is a high level.

Figure 1:
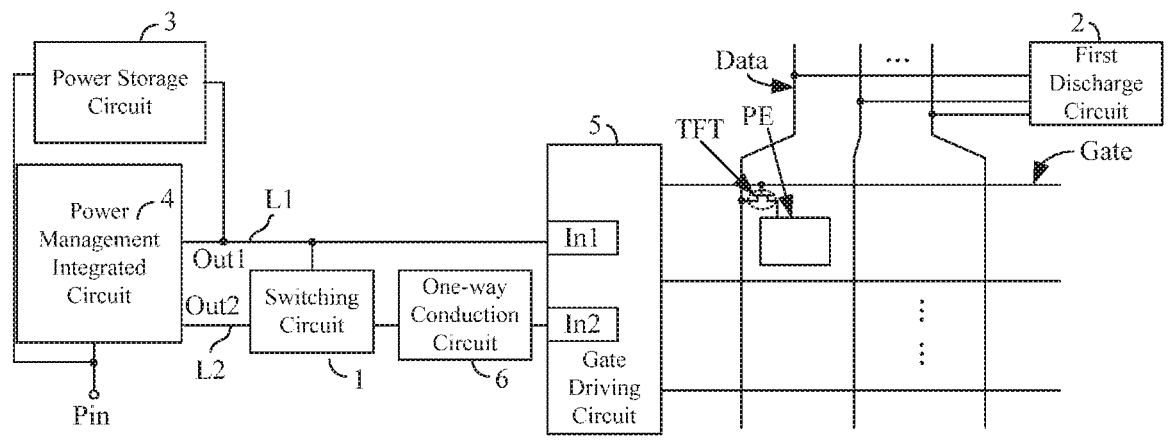
FIG. 1 is a schematic diagram showing a power-off discharge circuit for a display panel according to an embodiment of the present disclosure.

FIG. 1 is a schematic diagram showing a power-off discharge circuit for a display panel according to an embodiment of the present disclosure. As shown in FIG. 1, the power-off discharge circuit is configured to discharge the pixel electrodes PE in a display panel during the power-off stage. The display panel may include a power management integrated circuit 4 and a gate driving circuit 5. A first output terminal Out1 of the power management integrated circuit 4 is coupled to a first input terminal In1 of the gate driving circuit 5 via a first transmission line L1, and a second output terminal Out2 of the power management integrated circuit 4 is coupled to a second input terminal In2 of the gate driving circuit 5 via a second transmission line L2.

During a display stage of the display panel, a high-level voltage VGH is transferred via the first transmission line L1, and a low-level voltage VGL is transferred via the second transmission line L2. The high-level voltage VGH is received by the first input terminal In1 of the gate driving circuit 5, and the low-level voltage VGL is received by the second input terminal In2 of the gate driving circuit 5.

The power-off discharge circuit may include a switching circuit 1, a first discharge circuit 2, and a power storage circuit 3.

The switching circuit 1 is coupled to the first transmission line L1 and the second transmission line L2, and is configured to control a connection between the first transmission line L1 and the second transmission line L2 in response to a first control signal provided by a first control signal line CL1 of the switching circuit 1, and to control a connection between the second output terminal Out2 of the power management integrated circuit 4 and the second input terminal In2 of the gate driving circuit 5 in response to a second control signal provided by a second control signal line CL2 of the switching circuit 1.

In an embodiment, the switching circuit 1 is coupled to the first transmission line L1 and the second transmission line L2, and is configured to couple the first transmission line L1 to the second transmission line L2 in response to the first control signal provided by the first control signal line CL1 of the switching circuit 1 during the power-off stage of the display panel, and to disconnect the second transmission line L2 from the second output terminal Out2 of the power management integrated circuit 4 in response to the second control signal provided by the second control signal line CL2 of the switching circuit 1. The switching circuit 1 is configured to couple the first output terminal Out1 of the power management integrated circuit 4 to the first input terminal In1 and the second input terminal In2 of the gate driving circuit 5 via the first transmission line L1 and the second transmission line L2, and to disconnect the second output terminal Out2 of the power management integrated circuit 4 from the first input terminal In1 and the second input terminal In2 of the gate driving circuit 5.

The first discharge circuit 2 is coupled to data lines Data in the display panel, and configured to control a connection between the data lines Data and the ground in response to a third control signal provided by a discharge control terminal Xin of the first discharge circuit 2. In an embodiment, the first discharge circuit 2 is coupled to the data lines Data in the display panel, and configured to couple the data lines Data to the ground in response to the third control signal provided by the discharge control terminal Xin of the first discharge circuit 2 during the power-off stage, such that the pixel electrodes in the display panel are discharged.

The power storage circuit 3 is coupled to the first transmission line L1, and configured to store a part of power output from the power management integrated circuit 4 via the first transmission line L1 during the display stage, and to output the stored power to the first transmission line L1 during the power-off stage.

In an embodiment of the present disclosure, a power control signal provided to a power control terminal Pin of the power management integrated circuit 4 has a high level during the display stage of the display panel, and in this case, the power storage circuit 3 may store the high-level voltage VGH supplied to the first transmission line L1 from the power management integrated circuit 4 (i.e., power storage).

During the power-off stage of the display panel, since the power control signal drops rapidly to a low level from a high level (i.e., the voltage drops fast), the power management integrated circuit 4 stops supplying the high-level voltage to the first transmission line L1. However, since the power storage circuit 3 can supply power (i.e., supply a high-level voltage) to the first transmission line L1 after the power management integrated circuit 4 stops its operation, and since the second transmission line L2 is coupled to the first transmission line L1, the power storage circuit 3 may supply the high-level voltage to the second transmission line L2 at the same time. Therefore, after the operation of the power management integrated circuit 4 stops, the gate driving circuit 5 continues to output a high-level signal to the gate lines Gate for a period of time, so as to control the display transistors TFTs in the display panel to be turned on. The pixel electrodes PE are electrically coupled to the corresponding data lines Data respectively, and the pixel electrodes PE are discharged by the first discharge circuit 2.

It should be noted that the power storage process of the power storage circuit 3 is not limited to the above embodiment of the present disclosure, as long as the power storage circuit 3 can store power and supply the stored power to the first transmission line L1 during the power-off stage.

The gate driving circuit 5 is a logic circuit capable of outputting an active level (a high-level signal) in a case that each of the first input terminal In1 and the second input terminal In2 of the gate driving circuit 5 receives a high-level voltage, and outputting an active level (a high-level signal) in a case that the first input terminal In1 receives a high-level voltage and the second input terminal In2 receives a low-level voltage. It is well known that the gate driving circuit 5 outputs an active level (a high-level signal) according to the high-level voltages supplied to the first input terminal In1 and the second input terminal In2, and detailed description thereof will not be described here.

According to the embodiment of the present disclosure, the power storage circuit 3 may supply power to the gate driving circuit 5 after the power management integrated circuit 4 stops working, so as to maintain an active level output from the gate driving circuit 5, thereby lengthening a turned-on duration of the display transistors TFT during the power-off stage, facilitating the full discharge of the pixel electrodes PE in the display panel, and avoiding the occurrence of the afterimage.

In practical applications, many capacitors are electrically coupled to the second input terminal In2 of the gate driving circuit 5. As a result, in a case that the second transmission line L2 is disconnected from the power management integrated circuit 4, a large negative voltage exists at the second input terminal In2 (the second transmission line L2) due to the capacitors. In a case that the second transmission line L2 is electrically coupled to the first transmission line L1, a value of the high-level voltage on the first transmission line L1 may be pulled down by the negative voltage, thereby resulting in that the signal output from the gate driving circuit 5 cannot cause the display transistors TFT to be turned on. In order to solve such a technical problem, the power-off discharge circuit according to the embodiment of the present disclosure may include a one-way conduction circuit 6. The one-way conduction circuit 6 is coupled between the switching circuit 1 and the second input terminal In2 of the gate driving circuit 5. The one-way conduction circuit 6 has a current inflow terminal and a current outflow terminal. The current inflow terminal is coupled to the switching circuit 1, and the current outflow terminal is coupled to the second input terminal In2.

The one-way conduction circuit 6 only allows a current to flow from the switching circuit 1 to the second input terminal In2 of the gate driving circuit 5. Therefore, after the second transmission line L2 is electrically coupled to the first transmission line L1, the negative voltage remaining at the second input terminal In2 does not affect the high-level voltage on the first transmission line L1.

Figure 2:
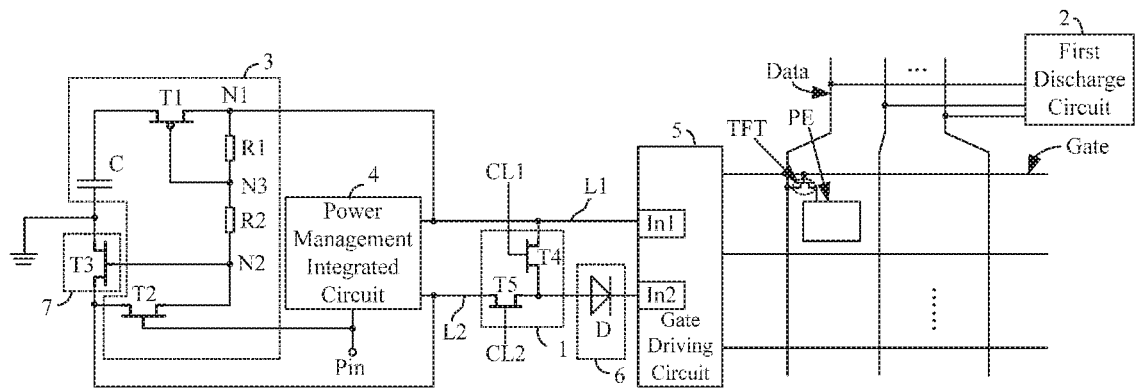
FIG. 2 is a schematic diagram showing a power-off discharge circuit for a display panel according to an embodiment of the present disclosure.
Figure 3:
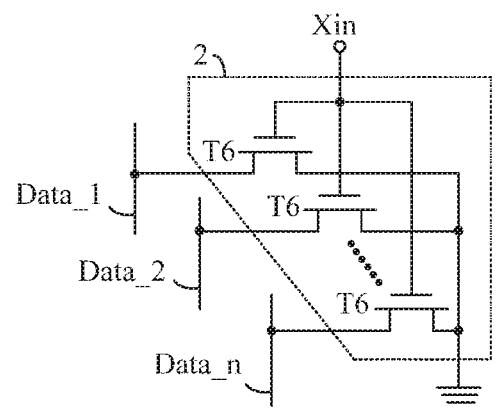
FIG. 3 is a schematic diagram showing the first discharge circuit as shown in FIG. 2.

FIG. 2 is a schematic diagram showing a power-off discharge circuit for a display panel according to an embodiment of the present disclosure, and FIG. 3 is a schematic diagram showing the first discharge circuit in FIG. 2.

As shown in FIG. 2, the power storage circuit 3 includes a first transistor T1, a second transistor T2, a first resistor R1, a second resistor R2, and a storage capacitor C. A control electrode of the first transistor T1 is coupled to a second terminal of the first resistor R1 and a first terminal of the second resistor R2 respectively, a first electrode of the first transistor T1 is coupled to a first terminal of the storage capacitor C, and a second electrode of the first transistor T1 is coupled to a first terminal of the first resistor R1 and the first transmission line L1 respectively. A control electrode of the second transistor T2 is coupled to the power control terminal Pin, a first electrode of the second transistor T2 is coupled to the second transmission line L2, and a second electrode of the second transistor T2 is coupled to a second terminal of the second resistor R2. A second terminal of the storage capacitor C is grounded.

In an embodiment, the power-off discharge circuit may further include a second discharge circuit 7. The second discharge circuit 7 is coupled to the second output terminal Out2 of the power management integrated circuit 4 and the power storage circuit 3 respectively, and configured to couple the power management integrated circuit 4 to the ground in response to a fourth control signal from the power storage circuit 3 (the fourth control signal refers to a control signal at the node N2 as shown in FIG. 2) during the power-off stage, so as to discharge the power management integrated circuit 4. In an embodiment, the second discharge circuit 7 includes a third transistor T3. A control electrode of the third transistor T3 is coupled to the second terminal of the second resistor R2, a first electrode of the third transistor T3 is grounded, and a second electrode of the third transistor T3 is coupled to the second output terminal Out2 of the power management integrated circuit 4 via the second transmission line L2.

In an embodiment, the switching circuit 1 includes a fourth transistor T4 and a fifth transistor T5. A control electrode of the fourth transistor T4 is coupled to a first control signal line CL1, a first electrode of the fourth transistor T4 is coupled to the first output terminal Out1 of the power management integrated circuit 4 and the first input terminal In1 of the gate driving circuit 5 via the first transmission line L1 respectively, and a second electrode of the fourth transistor T4 is coupled to a second electrode of the fifth transistor T5 and the second input terminal In2 of the gate driving circuit 5 respectively. A control electrode of the fifth transistor T5 is coupled to a second control signal line CL2, and a first electrode of the fifth transistor T5 is coupled to the second output terminal Out2 of the power management integrated circuit 4.

In an embodiment, the one-way conduction circuit 6 includes a diode D. An anode of the diode D is coupled to the second electrode of the fifth transistor T5, and a cathode of the diode D is coupled to the second input terminal In2 of the gate driving circuit 5.

As shown in FIG. 3, the first discharge circuit 2 includes: a plurality of sixth transistors T6 in one-to-one correspondence with the data lines Data_1, Data_2, . . . , Data_n. Each of control electrodes of the sixth transistors T6 is coupled to the discharge control terminal Xin, first electrodes of the sixth transistors T6 are coupled to the corresponding data lines Data_1, Data_2, . . . , Data_n, respectively, and each of second electrodes of the sixth transistors T6 is grounded.

In the present embodiment, the first transistor T1 is a P-type transistor, and the second transistor T2 to the sixth transistor T6 are all N-type transistors. In the present disclosure, "the control electrode" refers to a gate of the transistor, one of "the first electrode" and "the second electrode" refers to a source of the transistor, and the other of "the first electrode" and "the second electrode" refers to a drain of the transistor.

Figure 4:
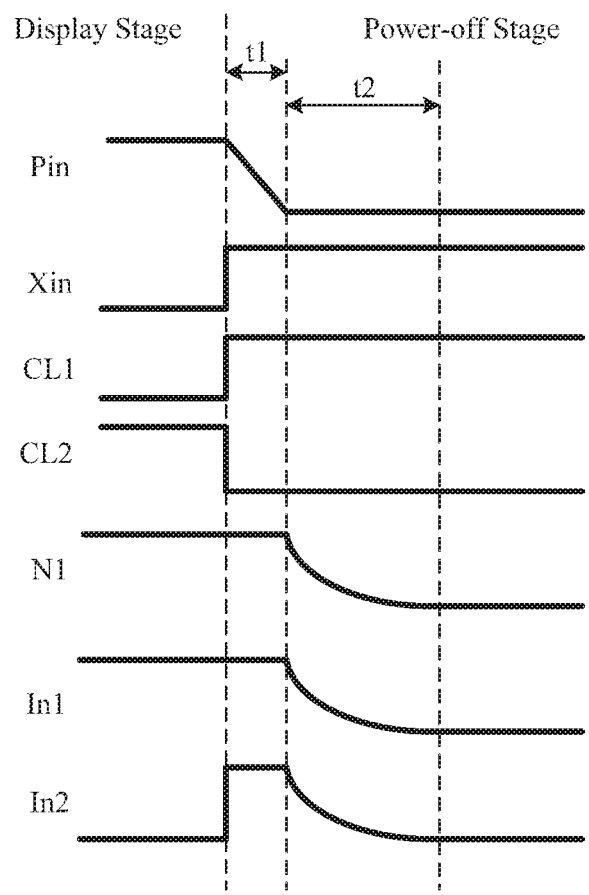
FIG. 4 is a timing diagram of the power-off discharge circuit shown in FIG. 2.

The operation process of the power-off discharge circuit shown in FIG. 2 will be described in detail below. FIG. 4 is a timing diagram of the power-off discharge circuit shown in FIG. 2. As shown in FIG. 4, the operation process of the power-off discharge circuit includes two stages, that is, a display stage and a power-off stage.

During the display stage, the power control signal provided to the power control terminal Pin has a high level, and the third control signal provided to the discharge control terminal Xin has a low level. The first control signal provided by the first control signal line CL1 has a low level, and the second control signal provided by the second control signal line CL2 has a high level.

Since the power control signal provided to the power control terminal Pin has a high level, the power management integrated circuit 4 operates normally. The power management integrated circuit 4 supplies a high-level voltage VGH to the first transmission line L1 and supplies a low-level voltage VGL to the second transmission line L2.

Since the first control signal has a low level and the second control signal has a high level, the fourth transistor T4 is turned off, and the fifth transistor T5 is turned on. The high-level voltage VGH is transferred to the first input terminal In1 of the gate driving circuit 5 via the first transmission line L1, and the low-level voltage VGL is transferred to the second input terminal In2 of the gate driving circuit 5 via the second transmission line L2. The gate driving circuit 5 operates normally and performs progressive scanning (driving) on the gate lines Gate.

The power control signal provided to the power control terminal Pin enables the second transistor T2 to be turned on, such that the low-level voltage VGL on the second transmission line L2 is written to a second node N2 via the second transistor T2. The third transistor T3 is turned off under the control of the voltage level (fourth control signal) at the second node N2. It can be known from the voltage division principle of the resistor that the voltage at the third node N3 is $$\frac{VGL*R1 + VGH*R2}{R1 + R2},$$

that is, the voltage at the third node N3 is smaller than the voltage VGH at the first node N1, and thus the first transistor T1 has a gate-source voltage Vgs less than zero. Since the first transistor T1 is a P-type transistor, the first transistor T1 is turned on, such that the high-level voltage is written to the first terminal of the storage capacitor C via the first transistor T1, and the storage capacitor C may store charges.

Since the third control signal provided to the discharge control terminal Xin of the first discharge circuit 2 has a low level, each of the sixth transistors T6 is turned off. The source driving circuit can provide a data voltage to the pixel electrode PE via the data line Data.

The power-off stage may include a first discharge stage t1 and a second discharge stage t2.

During the first discharge stage t1, the power control signal provided to the power control terminal Pin gradually decreases from a high level to a low level, the third control signal provided to the discharge control terminal Xin has a high level, the first control signal provided by the first control signal line CL1 has a high level, and the second control signal provided by the second control signal line CL2 has a low level.

Since the power control signal has not decreased to a low level yet, the power management integrated circuit 4 continues operating normally. The power management integrated circuit 4 outputs a high-level voltage VGH to the first transmission line L1 and a low-level voltage VGL to the second transmission line L2. At this time, the first transistor T1 and the second transistor T2 is maintained in a turned-on state, and the third transistor T3 is maintained in a turned-off state.

In addition, since the first control signal has a high level and the second control signal has a low level, the fourth transistor T4 is turned on, and the fifth transistor T5 is turned off. Therefore, the second electrode of the fourth transistor T4 is disconnected from the second output terminal Out2 of the power management integrated circuit 4, and the first transmission line L1 is coupled to the second input terminal In2 of the gate driving circuit 5 via the fourth transistor T4 that is turned on, such that the high-level voltage is transferred to the first input terminal In1 of the gate driving circuit 5 via the first transmission line L1 and to the second input terminal In2 of the gate driving circuit 5 via the fourth transistor T4 that is turned on. Since the high-level voltage is applied to both input terminals In1 and In2 of the gate driving circuit 5, each of the output terminals of the gate driving circuit 5 outputs a high-level signal. The gate lines Gate in the display panel are coupled to the corresponding display transistors TFTs respectively, and the pixel electrodes PE are electrically coupled to the corresponding data lines Data respectively.

At the same time, since the third control signal provided to the discharge control terminal Xin of the first discharge circuit 2 has a high level, each of the sixth transistors T6 is turned on, and thus the data lines Data are grounded to discharge the charges in the pixel electrodes PE.

It should be noted that, in the case where the high-level voltage VGH on the first transmission line L1 is transferred to the second input terminal In2 of the gate driving circuit 5 via the fourth transistor T4 that is turned on, the negative voltage remaining at the second input terminal In2 does not affect the high-level voltage VGH on the first transmission line L1 due to the presence of the diode D.

During the second discharge stage t2, the power control signal provided to the power control terminal Pin has a low level, the third control signal provided to the discharge control terminal Xin has a high level, the first control signal provided by the first control signal line CL1 has a high level, and the second control signal provided by the second control signal line CL2 has a low level.

Since the power control signal provided to the power control terminal Pin has a low level, the power management integrated circuit 4 does not operate. In this case, the second transistor T2 is switched to the turned-off state, and thus the voltage division cannot be realized with the first resistor R1 and the second resistor R2, and the voltages at the first node N1, the second node N2, and the third node N3 are equal to each other. Since the first transistor T1 has the gate-source voltage that is equal to zero (Vgs=0), the first transistor T1 is equivalent to a diode, a voltage at the first node N1 starts to decrease, and since a voltage at the first terminal of the storage capacitor C (the first electrode of the first transistor T1) is higher than the voltage at the first node N1, the storage capacitor C charges the first node N1 through the first transistor T1 to slow down the drop speed of the voltage at the first node N1. Each of the voltages at the second node N2, the third node N3, the first input terminal In1, and the second input terminal In2 is decreased with the voltage at the first node N1.

Before the voltage at the first node N1 is decreased to the low-level voltage VGL, the output terminals of the gate driving circuit 5 continuously output an active level that is decreased with the voltage at the first node N1, such that the display transistors TFT can be maintained in a turned-on state, and the pixel electrodes PE can still be discharged.

During this process, the third transistor T3 is turned on, and the power management integrated circuit 4 is coupled to the ground via the third transistor T3, so as to discharge the power management integrated circuit 4.

When the voltage at the first node N1 is decreased to the low-level voltage VGL, the second node N2, the third node N3, the first input terminal In1, and the second input terminal In2 are all at a low-level voltage VGL, such that the gate driving circuit 5 stops working, and the third transistor T3 is also in a turned-off state. Therefore, the display panel is completely in a power-off state.

The technical solution of the present disclosure can not only discharge the pixel electrodes before the power management integrated circuit stops working (in the first discharge stage), but also discharge the pixel electrodes during a period after the power management integrated circuit stops working (in the second discharge stage). Compared with the prior art, the power-off discharge circuit according to the present disclosure can effectively increase the discharge time of the pixel electrodes to ensure sufficient discharge of the pixel electrodes, thereby avoiding the occurrence of afterimage.

Moreover, in the present embodiment, since the control of the power storage circuit and the second discharge circuit only depends on the existing power control terminal and the first transmission line, it is unnecessary to provide an additional control signal line, thereby reducing the control difficulty and the number of wires.

A display substrate is provided in an embodiment of the present disclosure, and the display substrate includes the power-off discharge circuit in the embodiments described above, and details thereof are not described again here.

It should be noted that when the power-off discharge circuit is the power-off discharge circuit in the above embodiments, the transistors in the power-off discharge circuit can be simultaneously manufactured based on the existing array substrate process to avoid an increased manufacture process.

Figure 5:
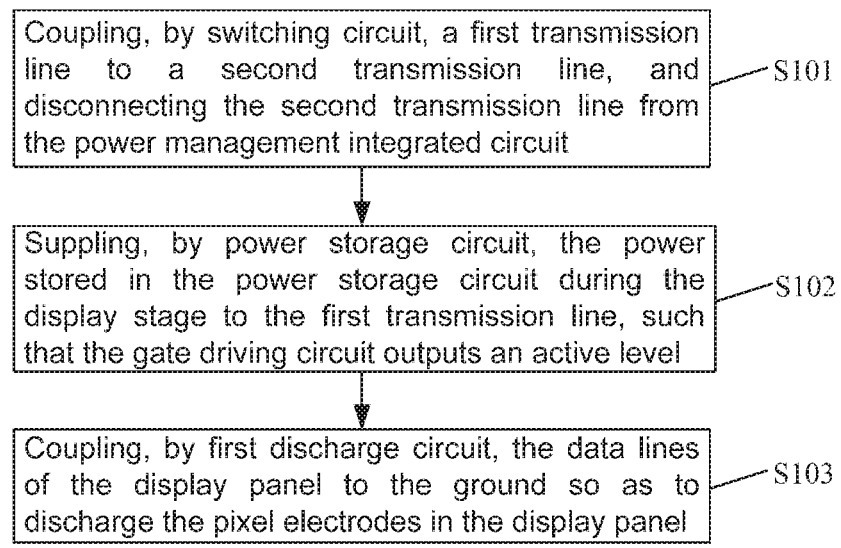
FIG. 5 is a schematic flowchart showing a method for operating a display panel according to an embodiment of the present disclosure.

FIG. 5 is a schematic flowchart showing a method for operating a display panel according to an embodiment of the present disclosure. As shown in FIG. 5, the method for operating a display panel is performed by using the power-off discharge circuit in the above embodiments, and the method includes steps S101 to S103.

At step S101, during the power-off stage of the display panel, a switching circuit 1 electrically couples a first transmission line to a second transmission line, and disconnects the second transmission line from the power management integrated circuit. In an embodiment, the switching circuit 1 couples the first output terminal Out1 of the power management integrated circuit 4 to the first input terminal In1 and the second input terminal In2 of the gate driving circuit 5, and disconnects the second output terminal Out2 of the power management integrated circuit 4 from the first input terminal In1 and the second input terminal In2 of the gate driving circuit 5.

At step S102, a power storage circuit 3 supplies power stored in the power storage circuit (e.g., the power stored during the display stage of the display panel) to the first transmission line L1, such that the gate driving circuit 5 outputs an active level, and then the display transistors in the display panel coupled to the corresponding gate lines are turned on, and the pixel electrodes are electrically coupled to the corresponding data lines.

At step S103, a first discharge circuit 2 couples the data lines of the display panel to the ground so as to discharge the pixel electrodes in the display panel.

The detailed descriptions of steps S101 to S103 have been described in the embodiments above, and are omitted here.

During the power-off stage of the display panel, a second discharge circuit 7 couples the second output terminal Out2 of the power management integrated circuit 4 to the ground, so as to discharge the power management integrated circuit.

During the display stage of the display panel, the switching circuit 1 couples the first output terminal Out1 of the power management integrated circuit 4 to the first input terminal In1 of the gate driving circuit 5 via the first transmission line L1, and couples the second output terminal Out2 of the power management integrated circuit 4 to the second input terminal In2 of the gate driving circuit 5 via the second transmission line L2.

During the display stage of the display panel, the power storage circuit 3 stores a part of power supplied from the power management integrated circuit 4.

During the display stage and the power-off stage of the display panel, a one-way conduction circuit 6 only allows a current to flow from the switching circuit 1 to the second input terminal In2 of the gate driving circuit 5.

During a display stage of the display panel, the first discharge circuit 2 disconnects the data lines Data from the ground.

In the method for operating a display panel according to an embodiment of the present disclosure, the power storage circuit 3 may supply power to the gate driving circuit 5 via the switching circuit 1 after the power management integrated circuit 4 stops working, so as to maintain an active level output from the gate driving circuit 5 may output, thereby lengthening a turned-on duration of the display transistors during the power-off stage, facilitating the full discharge of the pixel electrodes PE in the display panel, and avoiding the occurrence of the afterimage.

It should be understood that the above embodiments are merely exemplary embodiments for the purpose of illustrating the principles of the present disclosure. However, the present disclosure is not limited thereto. It will be apparent to those skilled in the art that various changes and modifications can be made without departing from the essence and spirit of the present disclosure, which are also to be regarded as falling within the scope of the present disclosure.

What is claimed is:

1. A power-off discharge circuit for a display panel, the display panel comprising a power management circuit and a gate driving circuit, wherein a first output terminal of the power management circuit is coupled to a first input terminal of the gate driving circuit via a first transmission line, and a second output terminal of the power management circuit is coupled to a second input terminal of the gate driving circuit via a second transmission line, and the power-off discharge circuit comprises:
    a switching circuit, coupled to the first transmission line and the second transmission line and configured to control a connection between the first transmission line and the second transmission line in response to a first control signal, and to control a connection between the second output terminal of the power management circuit and the second input terminal of the gate driving circuit in response to a second control signal;
    a power storage circuit, coupled to the first transmission line and configured to perform, in response to a power control signal, one of storing power transmitted from the first transmission line and supplying stored power to the first transmission line, and
    a one-way conduction circuit coupled between the switching circuit and the second input terminal of the gate driving circuit and configured to only allow a current to flow from the switching circuit to the second input terminal of the gate driving circuit.

2. The power-off discharge circuit according to claim 1, further comprising a first discharge circuit coupled to data lines of the display panel and configured to control a connection between the data lines and a ground in response to a third control signal.

3. The power-off discharge circuit according to claim 2, further comprising a second discharge circuit coupled to the second output terminal of the power management circuit and the power storage circuit and configured to control a connection between the second output terminal of the power management circuit and the ground in response to a fourth control signal from the power storage circuit.

4. The power-off discharge circuit according to claim 3, wherein the power storage circuit comprises: a first transistor, a second transistor, a first resistor, a second resistor, and a storage capacitor;
    a control electrode of the first transistor is coupled to a second terminal of the first resistor and a first terminal of the second resistor respectively, a first electrode of the first transistor is coupled to a first terminal of the storage capacitor, and a second electrode of the first transistor is coupled to a first terminal of the first resistor and the first transmission line respectively;
    a control electrode of the second transistor is coupled to a power control terminal of the power management circuit, a first electrode of the second transistor is coupled to the second output terminal of the power management circuit, and a second electrode of the second transistor is coupled to a second terminal of the second resistor; and
    a second terminal of the storage capacitor is grounded.

5. The power-off discharge circuit according to claim 4, wherein the switching circuit comprises a fourth transistor and a fifth transistor;
    a control electrode of the fourth transistor is coupled to a first control signal line for supplying the first control signal, a first electrode of the fourth transistor is coupled to the first transmission line, and a second electrode of the fourth transistor is coupled to the second transmission line; and
    a control electrode of the fifth transistor is coupled to a second control signal line for supplying the second control signal, a first electrode of the fifth transistor is coupled to the second output terminal of the power management circuit, and a second electrode of the fifth transistor is coupled to the second input terminal of the gate driving circuit.

6. The power-off discharge circuit according to claim 5, wherein the first discharge circuit comprises a plurality of sixth transistors in one-to-one correspondence with the data lines; and
    control electrodes of the plurality of sixth transistors are respectively coupled to a discharge control terminal for supplying the third control signal, first electrodes of the plurality of sixth transistors are respectively coupled to corresponding data lines, and second electrodes of the plurality of sixth transistors are grounded.

7. The power-off discharge circuit according to claim 6, wherein the second discharge circuit comprises a third transistor, and a control electrode of the third transistor is coupled to the second terminal of the second resistor, a first electrode of the third transistor is grounded, and a second electrode of the third transistor is coupled to the second output terminal of the power management circuit.

8. The power-off discharge circuit according to claim 7, wherein the one-way conduction circuit comprises a diode; and an anode of the diode is coupled to the second electrode of the fifth transistor, and a cathode of the diode is coupled to the second input terminal of the gate driving circuit.

9. The power-off discharge circuit according to claim 8, wherein the first transistor has a first conductive type; and
each of the second transistor, the third transistor, the fourth transistor, the fifth transistor, and the sixth transistor has a second conductive type different from the first conductive type.

10. A display substrate, comprising the power-off discharge circuit according to claim 1.

11. A method for operating a display panel, the display panel comprising a power management circuit and a gate driving circuit, wherein a first output terminal of the power management circuit is coupled to a first input terminal of the gate driving circuit via a first transmission line, and a second output terminal of the power management circuit is coupled to a second input terminal of the gate driving circuit via a second transmission line, and the method comprises during a power-off stage of the display panel:

coupling, by a switching circuit, the first transmission line to the second transmission line, and disconnecting the second transmission line from the power management circuit;

supplying, by a power storage circuit, power stored in the power storage circuit to the first transmission line, such that the gate driving circuit outputs an active level; and only allowing, by a one-way conduction circuit, a current to flow from the switching circuit to the second input terminal of the gate driving circuit.

12. The method according to claim 11, further comprising during a display stage of the display panel:

coupling, by the switching circuit, the first output terminal of the power management circuit to the first input terminal of the gate driving circuit via the first transmission line, and coupling, by the switching circuit, the second output terminal of the power management circuit to the second input terminal of the gate driving circuit via the second transmission line.

13. The method according to claim 11, further comprising:

storing, by the power storage circuit, a part of power output from the power management circuit during a display stage of the display panel.

14. The method according to claim 11, further comprising:

coupling, by a first discharge circuit, data lines of the display panel to a ground so as to discharge pixel electrodes in the display panel during the power-off stage of the display panel.

15. The method according to claim 14, further comprising:

disconnecting, by the first discharge circuit, the data lines from the ground during a display stage of the display panel.

16. The method according to claim 11, further comprising:

coupling, by a second discharge circuit, the second output terminal of the power management circuit to ground so as to discharge the power management circuit during the power-off stage of the display panel.

* * * * *